US011611322B2

(12) United States Patent
Lind et al.

(10) Patent No.: US 11,611,322 B2
(45) Date of Patent: *Mar. 21, 2023

(54) AUDIO AMPLIFIER ASSEMBLIES, PROCESSES, AND METHODS

(71) Applicant: QSC, LLC, Costa Mesa, CA (US)

(72) Inventors: Anders Lind, San Juan Capistrano, CA (US); Matthew Skogmo, Placentia, CA (US)

(73) Assignee: QSC, LLC, Costa Mesa, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/373,440

(22) Filed: Jul. 12, 2021

(65) Prior Publication Data

US 2022/0006435 A1    Jan. 6, 2022

Related U.S. Application Data

(63) Continuation of application No. 16/283,682, filed on Feb. 22, 2019, now Pat. No. 11,063,565.

(Continued)

(51) Int. Cl.
*H03F 3/68* (2006.01)
*H03F 3/183* (2006.01)
(Continued)

(52) U.S. Cl.
CPC .............. *H03F 3/68* (2013.01); *H03F 1/0277* (2013.01); *H03F 3/183* (2013.01); *H03F 3/185* (2013.01);
(Continued)

(58) Field of Classification Search
None
See application file for complete search history.

(56) References Cited

U.S. PATENT DOCUMENTS 8,365,168 B1    1/2013    Kodorkin et al.
8,558,618 B2    10/2013   Nussbaum et al.
(Continued)

FOREIGN PATENT DOCUMENTS

EP    1853086 A1    11/2007
EP    3169040 A1    5/2017
(Continued)

OTHER PUBLICATIONS

Heo, Jin. "Voice over IP (VoIP) Performance Evaluation on VMware vSphere 5.0," Performance Study, Technical Whitepaper. Dec. 1, 2015, pp. 1-10. Retrieved from internet on Feb. 3, 2022 < www.vmware.com/content/dam/digitalmarketing/vmware/en/pdf/techpaper/voip-performance-vsphere5-whitepaper>.

(Continued)

*Primary Examiner* — Paul W Huber
(74) *Attorney, Agent, or Firm* — Perkins Coie LLP

(57) ABSTRACT

An amplifier having one or more channels where each channel includes a two half bridges (a master and slave sub-channel). The sub-channels can be connected either in parallel or in a full-bridge configuration via internal switches that route signals to a pair of speaker jacks. One switch in the amplifier has a first position that selectively connects the outputs of the master and slave sub-channel to the same input of the speaker load so that the two sub-channels will drive the speaker load in parallel and a second position where the output of the slave sub-channel is connected to another input of the speaker load so that the master sub-channel and the slave sub-channel will drive the speaker load in a Full-bridge configuration. A second switch has a first position that connects a second input of the speaker load to ground or reference potential of the sub-channels when the speaker load is to be driven in parallel and a second position that is a No-connect position that is used when the (Continued)

speaker load is driven in the Full-bridge configuration and a ground potential is not to be connected to the speaker.

20 Claims, 11 Drawing Sheets

Related U.S. Application Data

(60) Provisional application No. 62/634,774, filed on Feb. 23, 2018.

(51) Int. Cl.
*H03F 3/217* (2006.01)
*H04R 3/00* (2006.01)
*H03F 1/02* (2006.01)
*H03F 3/185* (2006.01)

(52) U.S. Cl.
CPC .......... *H03F 3/2173* (2013.01); *H04R 3/00* (2013.01); *H03F 2200/03* (2013.01); *H03F 2200/321* (2013.01)

(56) References Cited

U.S. PATENT DOCUMENTS

| | | | |
|---|---|---|---|
| 8,738,972 | B1 | 5/2014 | Bakman et al. |
| 9,223,635 | B2 | 12/2015 | Huang et al. |
| 9,258,266 | B2 | 2/2016 | Nataraja et al. |
| 9,543,913 | B2 | 1/2017 | Quilter et al. |
| 10,901,809 | B2 | 1/2021 | Rosenboom |
| 11,063,565 | B2 | 7/2021 | Lind et al. |
| 2005/0091051 | A1 | 4/2005 | Moriya et al. |
| 2008/0002663 | A1 | 1/2008 | Tripathi et al. |
| 2008/0019365 | A1 | 1/2008 | Tripathi et al. |
| 2010/0011200 | A1 | 1/2010 | Rosenan |
| 2010/0058335 | A1 | 3/2010 | Weber |
| 2010/0107162 | A1 | 4/2010 | Edwards et al. |
| 2010/0146544 | A1 | 6/2010 | Aoki et al. |
| 2011/0078681 | A1 | 3/2011 | Li et al. |
| 2011/0090915 | A1 | 4/2011 | Droux et al. |
| 2012/0184373 | A1 | 7/2012 | Kim et al. |
| 2012/0198444 | A1 | 8/2012 | Tsai |
| 2012/0230519 | A1 | 9/2012 | Nussbaum et al. |
| 2012/0296626 | A1 | 11/2012 | Bond et al. |
| 2014/0080428 | A1 | 3/2014 | Rhoads et al. |
| 2014/0082612 | A1 | 3/2014 | Breitgand et al. |
| 2014/0123135 | A1 | 5/2014 | Huang et al. |
| 2014/0192989 | A1 | 7/2014 | Quilter et al. |
| 2015/0127830 | A1 | 5/2015 | Brown et al. |
| 2015/0146716 | A1 | 5/2015 | Olivier et al. |
| 2015/0264035 | A1 | 9/2015 | Waterhouse et al. |
| 2016/0241604 | A1 | 8/2016 | Klein et al. |
| 2016/0360317 | A1 | 12/2016 | Lee et al. |
| 2017/0055076 | A1 | 2/2017 | Buono et al. |
| 2019/0220299 | A1 | 7/2019 | Rosenboom |
| 2019/0220300 | A1 | 7/2019 | Rosenboom |
| 2019/0220328 | A1 | 7/2019 | Rosenboom |
| 2019/0267957 | A1 | 8/2019 | Lind et al. |

FOREIGN PATENT DOCUMENTS

| | | |
|---|---|---|
| JP | 2009253524 A | 10/2009 |
| WO | 2014066820 A2 | 5/2014 |

OTHER PUBLICATIONS

Wikipedia. "Advanced Linux Sound Architecture", Dec. 11, 2017, 5 pages. <en.wikipedia.org/w/index.php?title=Advanced_Linux_Sound_Architecture&oldid=814921790> accessed on Feb. 11, 2022.
International Searching Authority, International Search Report and Written Opinion, PCT Patent Application PCT/US2018/067358, dated Mar. 27, 2019, 11 pages.
International Searching Authority, International Search Report and Written Opinion, PCT Patent Application PCT/US2018/067368, dated May 14, 2019, 17 pages.
International Searching Authority, International Search Report and Written Opinion, PCT Patent Application PCT/US2018/067379, dated May 20, 2019, 18 pages.
International Searching Authority, International Search Report and Written Opinion, PCT Patent Application PCT/US2019/019307, dated Sep. 12, 2019, 20 pages.
International Searching Authority, Partial International Search Report, PCT Patent Application PCT/US2018/067368, dated Mar. 19, 2019, 13 pages.
International Searching Authority, Partial International Search Report, PCT Patent Application PCT/US2018/067379, dated Mar. 27, 2019, 13 pages.
Xi, Sisu et al. "Rt-open stack: CPU resource management for real-time cloud computing." 2015 IEEE 8th International Conference on Cloud Computing, pp. 179-186.

AUDIO AMPLIFIER ASSEMBLIES, PROCESSES, AND METHODS

CROSS-REFERENCE TO RELATED APPLICATION(S)

This application is a continuation of U.S. patent application Ser. No. 16/283,682 filed Feb. 22, 2019, which claims the benefit of, and priority to, U.S. Provisional Patent Application No. 62/634,774 filed Feb. 23, 2018, both of which are herein incorporated by reference in their entirety.

TECHNICAL FIELD

The disclosed technology relates to audio amplifiers.

BACKGROUND

Most professional audio amplifiers are limited in the range of speaker loads they can drive to full-rated power based on the maximum current the amplifier's transistors can conduct or the maximum voltage on the power supply rails that the transistors can block. Amplifier configurations have been developed to increase the range of speakers loads that can be driven by selectively summing channels together in parallel or by connecting channels together in a bridge tied load (BTL) configuration. One example of such a configurable amplifier is disclosed in U.S. Pat. No. 9,543,913, which is herein incorporated by reference. The technology disclosed in the '913 patent is referred to below as Fast Amplitude and Summing Technology (FAST).

The technology described herein seeks to improve upon the FAST by, among other things, making it easier for a user to connect speakers to an amplifier.

SUMMARY

As will be discussed in detail below, the disclosed technology relates to an audio amplifier having one or more channels where each channel includes two sub-channels. A first switch selectively connects an output of a second sub-channel to the same speaker terminal that is connected to an output of the first sub-channel such that the outputs of the first and second sub-channels can drive a speaker load in parallel The first switch can also selectively connect the output of the second sub-channel to a second speaker terminal such that the first and second sub-channels can drive the speaker in a bridge tied load (BTL) configuration. A second switch of the channel selectively connects a ground of the second sub-channel to the second speaker terminal when the speaker is to be driven in parallel or can be set to a no connection position when the speaker is to be driven in the BTL configuration.

A processor or logic circuitry in the amplifier is configured to set the position of the first and second switches based on information received or detected regarding the impedance and power rating of a speaker load that is connected to the first and second speaker terminals.

Figure 1:
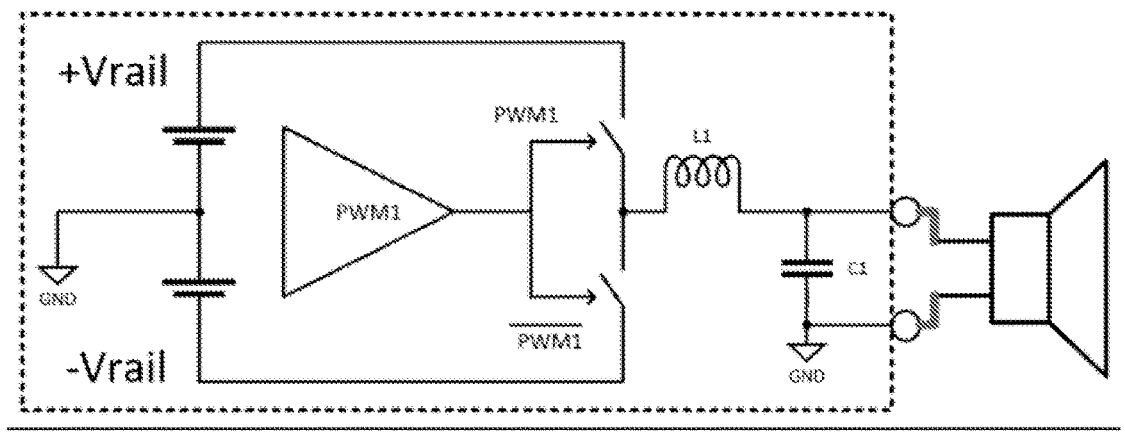
FIG. 1 is a schematic of a typical class D audio amplifier output stage in an HB (Half-Bridge) configuration (prior art).

Embodiments of the audio amplifier, system and methods introduced herein may be better understood by referring to the following Detailed Description in conjunction with the accompanying drawings.

DETAILED DESCRIPTION

Various examples of the audio amplifiers, systems and methods introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. The embodiments are intended to cover all modifications, equivalents, and alternatives falling within the scope of the embodiments.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

New rack-amplifiers (or other professional audio amplifiers including "Plate-amps" for powered speakers) today are mostly implemented using a class D topology with pulse modulation, such as Pulse Width Modulation ("PWM"). The benefit of class D (vs. classes A, B, A/B, H, etc.) are the output semi-conductors' "ON" or "OFF" states compared to traditional semiconductors driven in the linear region. Semiconductors dissipate power according to Ohm's law: the voltage across it multiplied by the current through it. In a class D amplifier, the semiconductor 'switches' are either fully "ON"—which ideally means the voltage across them is 0V or fully "OFF"—which means they carry no current. Thereby—ideally—there is no power loss in a class D amplifier stage. However, in the transition times when the switch goes from being "OFF" to "ON" and vice versa, the switch does dissipate some power (switching losses). During the "ON" time, the switch has a non-zero ON-resistance (non-0V voltage), which means it does dissipate some power (conduction losses). The amount of switching losses and conduction losses are a function of how close to ideal the semi-conductor switch is. The most common (by far) utilized semi-conductor switch for class D is the MOSFET (Metal-Oxide Semi-Conducting Field-Effect Transistor). The selection of which MOSFET to use for a class D amplifier is based on several factors including the voltage it must be able to block and the current it must be able to conduct. Generally (and quite fundamentally) the higher the voltage, the less ideal (and more costly) the MOSFET—and the higher the current, the less ideal (and more costly) the MOSFET.

In the professional audio industry, amplifiers can be required to drive vastly different load (speaker) impedances. In some applications, there is a need to drive speaker loads with impedances as low as 2 Ω (or even less), whereas in distributed sound systems, there is a need to minimize speaker wire current conduction, and sound may be distributed at a constant voltage (typically 70 Vrms or 100 Vrms). Traditionally, audio-formers were used as accessories to translate between the "low-Z" (typically 2 Ω to 8 Ω range of speaker loads) and "high-Z" (typically 70 Vrms and 100 Vrms distributed audio) modes. However, industry trends drove adoption of "direct drive" for the distributed sound systems, which resulted in manufacturers having to produce two different models of each amplifier: a "low-Z" version and a "high-Z" version. Each version facilitated optimized output transistor switch selection (high current, but low voltage capability for the low-Z MOSFETs, versus high voltage, but low current for the high-Z MOSFETs).

Figure 2:
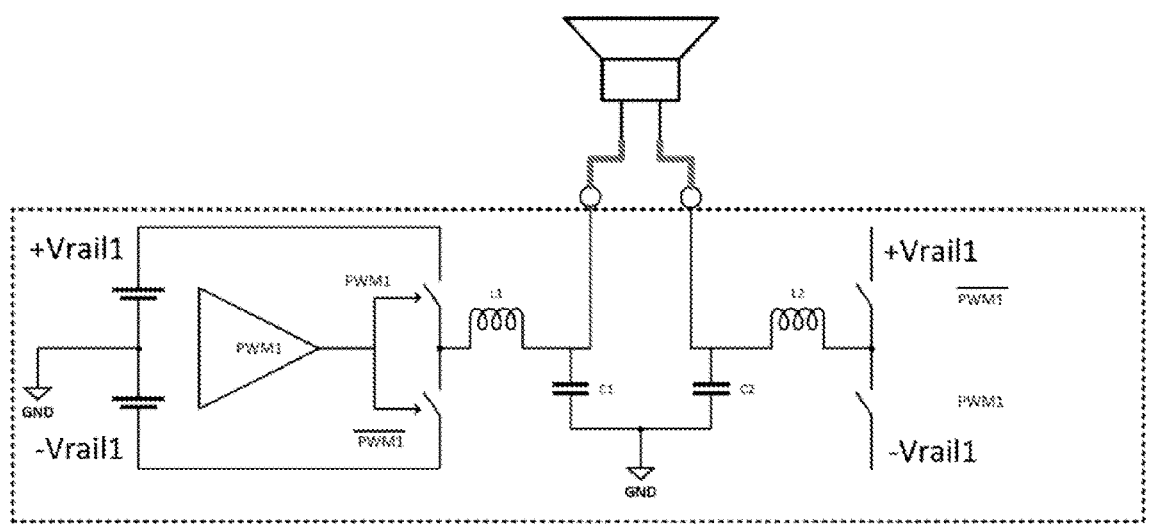
FIG. 2 is a schematic of a conventional FB (Full-Bridge) class D audio amplifier topology, which may be referred to as a "BTL" (Bridge-Tied-Load) configuration (prior art).

FIGS. 1 and 2 illustrate conventional class D type amplifier configurations. As will be appreciated by those of ordinary skill in the art, the topology of FIG. 1 represents a half-bridge (HB) amplifier where a pair of MOSFET output transistors are driven to push current into, or pull current from, a speaker load. In this configuration, the power that can be delivered to the load is limited by the maximum sustained current the output transistors can deliver or the maximum voltage on the power supply rails he transistors can block.

FIG. 2 shows a class D amplifier in a bridge tied load configuration where two half bridges are used to drive a speaker load. The half bridges are driven out of phase effectively doubling the voltage across the speaker and therefore increasing the power that can be delivered.

A new trend is emerging, where a single amplifier unit is able to drive virtually any load impedance. This is reducing the number of models that amplifier manufacturers need to offer and simplifies the customer choice/selection in purchasing. Conventional amplifier topologies that can drive a wide variation in loads usually come with compromises in the output MOSFET selection. In order to provide both high voltage and high current in a single unit, the 2 Ω performance typically suffers (output current is limited due to suboptimal output switch characteristics—even for higher cost devices). Alternatively, if a Full-Bridge("FB") configuration is used, the ability to externally bridge-tie the amplifiers together (a technique valued by end-users) is limited, and the configuration sub-optimally uses the necessary MOSFETs (twice the number needed compared to the HB configuration). The main criteria required by end-users for a truly versatile amplifier are:

It must provide ample power (current) in load ranges from approximately 2 Ω to 8 Ω

It must be bridge-able (in a traditional sense) into loads as low as approximately 4 Ω (2 Ω seen per channel)

It must be able to direct-drive approximately 70 Vrms and 100 Vrms distributed audio zones The requirement for external bridge-ability eliminates the possibility of using the classic permanently configured FB configuration as shown in FIG. 2, since this (in essence) is already internally bridge-tied.

The need for 100 Vrms necessitates Vrail voltages of +/−142V (minimum; leaving no headroom), which calls for MOSFETs with minimum voltage ratings of ~355V (using industry standard 20% derating). At ~200V MOSFET voltage rating, the technologies get much better, so there is strong motivation to stick with 200V or lower for the MOSFET voltage rating. Particularly for MOSFETs of high output current capability (such as 2 Ω load currents), the cost and performance diminish for voltage ratings greater than 200V.

So at least the problem that aspects of the disclosed technology addresses is: How to ensure output currents appropriate for a 2 Ω load impedance, bridge-ability into 4

Ω (and above) load impedance and 70 Vrms/100 Vrms direct drive without relying on MOSFETs with high current- and voltage-rating concurrently?

Aspects of the disclosed technology provide a solution that helps solve the problem described above. For purposes of discussion, the following tables provide an actual example of where the real limitations lie in amplifier output power, and establish the configuration methodology used in the prior art.

Consider a 4-channel audio amplifier constructed with four half-bridges. The amplifier is using +/−85V rails to allow for 200V rated devices (with 15% de-rating). At highest PWM duty cycle this can produce 57 Vrms of output voltage. The devices are chosen to be capable of delivering 5 Arms of output current to the load. These devices are efficient and allow the thermal system to handle 100W of power per HB channel. The power supply unit (PSU) is dimensioned to be capable of delivering 400W total audio power. It should be noted that although embodiments are discussed regarding Pulse Width Modulation schemes, other pulse modulation schemes could be used. For example, the disclosed technology may use Pulse Amplitude Modulation (PAM), Pulse Density Modulation (PDM), Pulse Position Modulation (PPM), or other pulse modulation schemes or techniques.

The power limits per channel are thus:

TABLE 1

HB power limitations for amplifier design

| Half Bridge (HB) Load | Power limit by current ($Irms^2 \cdot R$) | Power limit by voltage ($Vrms^2/R$) | Power limit by thermal |
|---|---|---|---|
| 2Ω | 50 W | 1625 W | 100 W |
| 2.67Ω | 67 W | 1217 W | 100 W |
| 4Ω | 100 W | 813 W | 100 W |
| 8Ω | 200 W | 406 W | 100 W |
| 49Ω (~100 W @ 70 Vrms) | 1225 W | 67 W | 100 W |
| 100Ω (~100 W @ 100 Vrms) | 2500 W | 33 W | 100 W |

It is clearly seen from Table 1 that the amplifier can only be designated "4×100W" with a 4 Ω or 8 Ω load impedance, where the thermal specifications of the components are determining the limits. In the low impedance load (2 Ω), the device current limitation is causing the output power to be limited to just 50W. In the "high-Z" loads (70V/100V), there is clearly not enough voltage excursion (57 Vrms limit) to even meet the requirement for those systems. The voltage imposes a limit of just 33W for 100V distributed audio (when load tab is set to 100W setting on the speaker).

Figure 3:
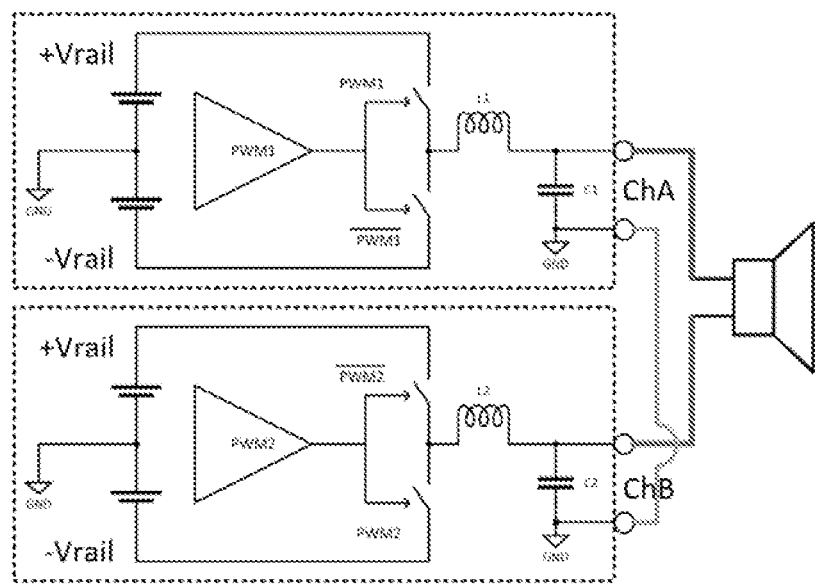
FIG. 3 is a schematic of an external BTL traditional coupling (prior art).

"BTL": overcoming the voltage limitation—A classic approach to overcoming the voltage limitation is to couple ChA and ChB together in the following manner:
ChA−terminal to ChB−terminal
ChA+terminal to SPK input +
ChB+terminal to SPK input −
Audio input for ChA is inverted and fed to ChB (symbolized in FIG. 3 by PWM2 inverted compared to PWM1)

This will cause the speaker to see twice the voltage of each channel (GND is the "mid-point" of speaker voltage). The amplifier from the example above, which was power limited by voltage in high-Z loads, is now a two-channel amplifier (rather than four channels, although it retains four sets of speaker terminals), but the limit-table looks quite different:

TABLE 2

BTL power limitations for amplifier dimensioning

| BTL Load | Power limit by current | Power limit by voltage | Power limit by thermal |
|---|---|---|---|
| 2Ω | 50 W | 6498 W | 200 W |
| 2.67Ω | 67 W | 4868 W | 200 W |
| 4Ω | 100 W | 3249 W | 200 W |
| 8Ω | 200 W | 1625 W | 200 W |
| 24.5Ω (~200 W @ 70 Vrms) | 613 W | 200 W | 200 W |
| 50Ω (~200 W @ 100 Vrms) | 1250 W | 200 W | 200 W |

The BTL amplifier does overcome the voltage limitation of the high-Z load but retains the current limitation (unchanged) of the 2 Ω load impedance. A further (big) drawback is that although four sets of input signal connections, and four sets of speaker terminals remain on the chassis, only two channels are available for use.

Figure 4:
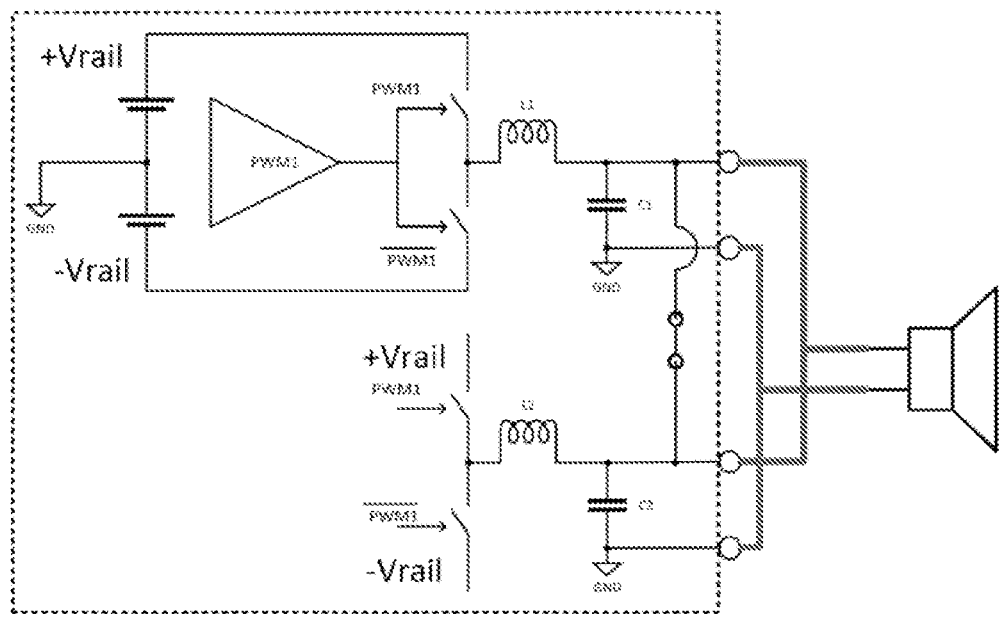
FIG. 4 is a schematic view of an amplifier including Flexible Amplifier Summing Technology ("FAST") for combining channels (prior art).

"FAST": overcoming the current limitation—Applicant has developed a Flexible Amplifier Summing Technology ("FAST") system that is described in U.S. Pat. No 9,543,913 (herein incorporated by reference), whereby a PWM signal is 'copied' from one (HB) channel to another. With the FAST technology described in the '913 patent, an amplifier includes two half bridges and one or more internal switches that connect the outputs of the half bridges together as shown in FIG. 4 in order to parallel two or more half bridges together. Another benefit of some implementations of the FAST technology is that feedback loops for the slave channel of a parallely-connected half bridge can eliminated.

The system effectively parallels two class D output HB stages; increasing the current capability (effectively doubling it). Going back to the HB dimensioning exemplified above, the power limitation table now looks like this:

TABLE 3

"FAST" power limitations for amplifier dimensioning

| Parallel HB Load | Power limit by current | Power limit by voltage | Power limit by thermal |
|---|---|---|---|
| 2Ω | 200 W | 1625 W | 200 W |
| 2.67Ω | 267 W | 1217 W | 200 W |
| 4Ω | 400 W | 813 W | 200 W |
| 8Ω | 800 W | 406 W | 200 W |
| 24.5Ω (~200 W @ 70 Vrms) | 2450 W | 133 W | 200 W |
| 50Ω (~200 W @ 100 Vrms) | 5000 W | 65 W | 200 W |

The "FAST" system overcomes the current limitation for the 2 Ω load impedance (but not the voltage limitation for high-Z). In some commercial embodiments with four half bridge sections, the amplifier still uses 4 sets of input/output connections, even though in reality it is 'only' a two-channel amplifier, and the end-user must configure the firmware ("FW") inside the product (to "FAST" mode) as well as externally on the chassis (although internal relay switches already provide some freedom of external connections). But a benefit is that if two channels are run in parallel there are still two remaining channels with which it is still possible to externally connect a speaker in a BTL configuration in the traditional manner.

A product implementing optional "FAST" technology is then extremely versatile in that it allows for configuration of two channels into a single channel, configured in either high-Z mode (e.g. BTL) or low-Z mode (e.g. parallel); making available all the power of the amplifier in to any load (although at ½ the channel-count).

In a "FAST" enabled four-channel amplifier, the full power is only available through the full load range when combining channels thereby making it into a two-channel amplifier. The benefit is of course that if loading by a more narrow range of speaker loads (for example exactly 4 Ω or 8 Ω load impedance as mentioned above or another range depending on amplifier dimensioning and power rating which results in different trade-off points), all four channels are available with the full amplifier power. However, the drawback is the additional cost (and space) of the hardware associated with the additional (low-power) half bridge channels.

Despite the benefits of the conventional FAST technology, improvements can be made. For example, it is desirable to design an amplifier that can drive both low and high impedance speaker loads without requiring the user to connect a speaker load differently at the speaker output terminals/jacks. As described in detail below, the disclosed technology is an amplifier having one or more channels where each channel includes two half bridges (a master and a slave sub-channel). The sub-channels can be selectively connected either in parallel or in a Full-Bridge configuration via internal switches that route signals to a pair of speaker terminals. One switch in the amplifier has a first position that selectively connects the output of the slave sub-channel and the output of the master sub-channel to the same input of the speaker load so that both sub-channels will drive the speaker load in parallel and a second position where the output of the slave sub-channel is connected to another input of the speaker load so that the master sub-channel and the slave sub-channel will drive the speaker load in a Full-Bridge configuration. A second switch has a first position that connects a second input to the speaker load to ground when the speaker load is to be driven in parallel and a second position that is No-Connect (NC) that is used when the speaker load is to be driven in the Full-Bridge configuration (and thereby NOT ground-referenced).

The slave sub-channel can omit some components of the master sub-channel. For example, the slave sub-channel does not need its own pulse width modulator, error correction loop components, or analog configuration selection switches. In some embodiments, a speaker load is connectable to a single pair of speaker terminals/jacks, thereby eliminating the requirement of separate speaker terminals for each sub-channel to drive the load in a BTL configuration. In some embodiments, the "FAST" output relay (Single Pole Single Throw ("SPST") switch) shown in FIG. 4 is replaced with two SPDT switches instead.

Although the description given herein refers to a speaker load as the impedance of a single speaker, it will be appreciated that a speaker load could comprise one or more speakers connected in series or in parallel that is driven by an amplifier channel.

Figure 5:
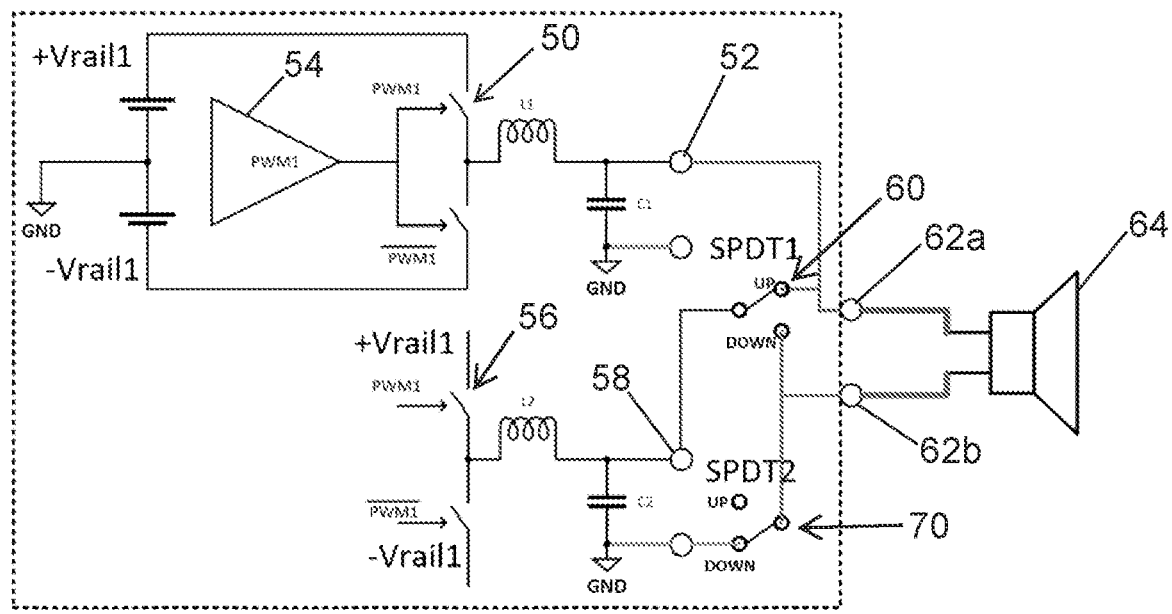
FIG. 5 is a schematic view of an implementation of the disclosed technology with an amplifier having two Single Pole Double Throw (SPDT) switches in a Current Doubling ("CD") configuration.

FIG. 5 is a schematic diagram of a amplifier channel in accordance with some embodiments of the disclosed technology. In the embodiment shown, an amplifier channel includes a first half bridge sub-channel 50 having an output 52 after a filter of the sub-channel. A second half bridge sub-channel 56 has an output 56. A pair of single pole double throw SPDT switches 60, 70 connect the outputs of the sub-channels to a pair of speaker terminals 62a, 62b to which a speaker load 64 is connected. The SPDT switch 60 has an up position that connects the output 58 of the second subchannel 56 to the same speaker terminal 62a to which the output 52 of the first subchannel 50 is connected. The SPDT switch 60 also has a down position that connects the output 58 of the second subchannel 56 to the second speaker terminal 62b. The second SPDT switch 70 has a down position that connects the speaker terminal 62b to a ground for the subchannels. The SPDT 70 also has a second or up position that is the "no contact" position.

In the embodiment shown, the amplifier channel has a single modulator 54 that can produce the same driving signals for the subchannels or can provide one of the subchannels with a driving signal that is inverted compared with the driving signal for the other subchannel.

In one embodiment, the present technology provides an improvement to the technology disclosed in the '913 patent, wherein the present technology can use or set up a truth table with all the configuration options when considering:
SPDT1 60 may be in the UP position or in the DOWN position
SPDT2 70 may be in the UP position or in the DOWN position
PWM1 fed to the lower HB may be a straight copy (not inverted) or inverted In the following the various configurations and their merits will be discussed:
Configuration 1 Current Doubling ("CD"):
The CD configuration is selected by:
SPDT1 60=UP
SPDT2 70=DOWN
PWM=Not Inverted In this configuration as shown in FIG. 5, SPDT1 60 connects the output of the slave sub-channel 56 and the output of the master sub-channel 50 together to the same input 62a of the speaker load. SPDT2 70 is set to connect the second input 62b of the speaker load to ground so that both sub-channels 50, 56 drive the speaker load 64 in parallel. The slave sub-channel 56 is driven with the non-inverted PWM input that drives the master sub-channel 50. An amplifier with two sub-channels configured in this manner will produce full rated power into low-Z loads (see Table 3 above). The chassis only requires a single input to provide the PWM signals for the two half-bridges and a single set of output connectors (speaker terminals) for the speaker load, so the end user can simply connect the speaker 64 in the simple, traditional manner. The resulting output channel retains the ability to externally drive the speaker load in a BTL configuration with another channel having a pair of output terminals in the traditional manner as well. This configuration is analogous to the known "FAST" channel combining. A single channel configured in this manner (out of two HB's) can still be "FAST" combined with other channels. In such a case, the "PWM1" signal will simply be an input from another modulator rather than generated by the internal modulator 54 shown in FIG. 5.

Figure 6:
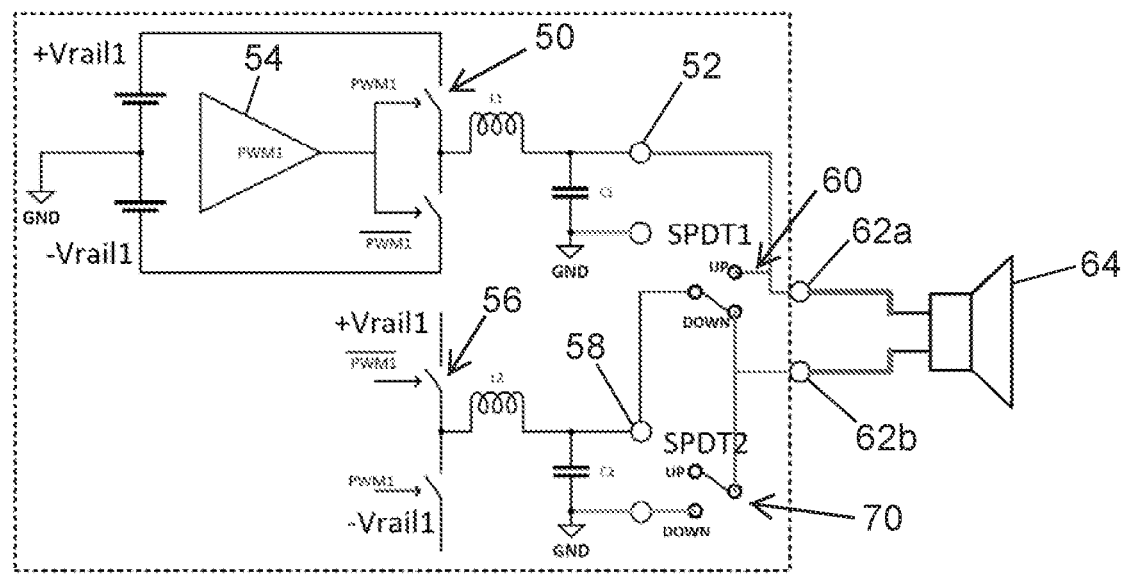
FIG. 6 is a schematic of an embodiment of the amplifier of FIG. 5 in a Voltage Doubling ("VD") configuration.

Configuration 2—Voltage Doubling ("VD"):
The VD configuration is selected by:
SPDT1 60=DOWN
SPDT2 70=UP
PWM=Inverted In the configuration shown in FIG. 6, the first SPDT1 60 is set to connect the output 58 of the slave sub-channel 56 to the second input 62b of the speaker load and the second SPDT2 70 is set to a NC (No-Connect) in order to disconnect the speaker load from "GND". In this configuration, the speaker load 64 is driven in a Full-Bridge configuration by the two sub-channels 50, 56. The slave sub-channel 56 is driven with an inverted PWM input signal that drives the master sub-channel 50. In this configuration, an amplifier with two HBs will produce full rated power into high-Z loads (see Table 2 above). Again, the chassis only requires a single f input (not shown) to provide the PWM signals for both sub-channels 50,56 and a single set of output terminals 62am 62b for the two half-bridges to connect to a speaker, so the end user can simply connect the speaker in the simple, traditional manner. With the switches set in this configuration, it is generally not possible for a user to configure a speaker in a conventional externally connected BTL topology.

Figure 7:
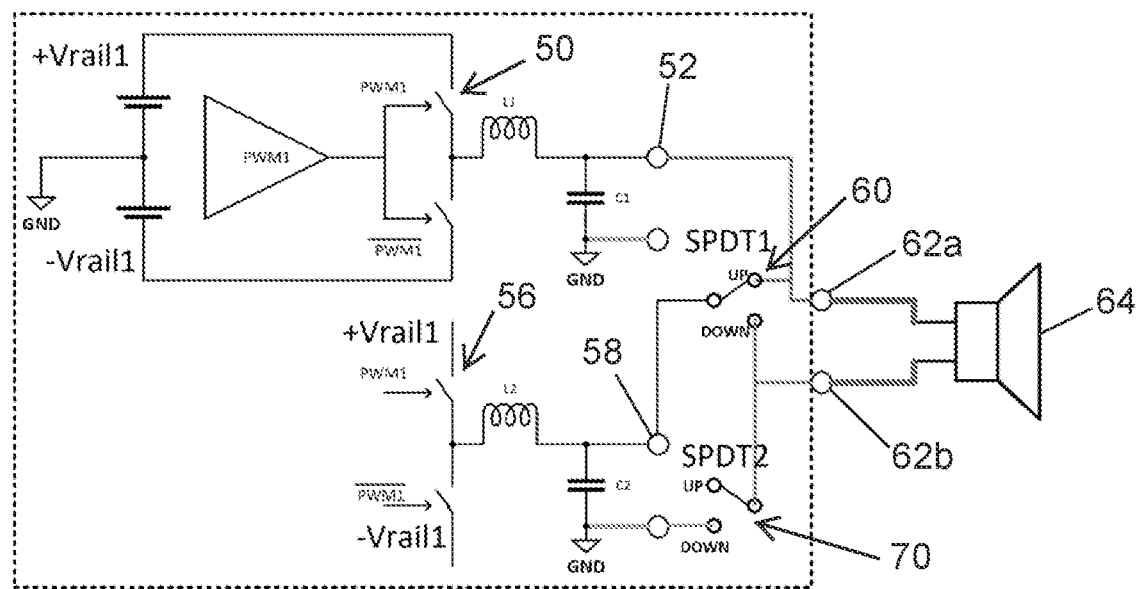
FIG. 7 is a schematic of an embodiment of the amplifier of FIG. 5 in a Load Disconnect ("LD") configuration.

Configuration 3—Load Disconnect ("LD"):
  The LD configuration is selected by:
  SPDT1 60=UP
  SPDT2 70=UP
  PWM=Not Inverted In the configuration shown in FIG. 7, the two 'positive' sub-channel HB outputs 52, 58 are tied together by the position of SPDT1 60 and driven by the same PWM signal, which means no current will flow (other than filter ripple current). The 'negative' terminal 62b on the speaker 64 is floating as determined by the position of SPDT2 70 being set to the NC position and therefore no current flows through the speaker.

Uses for this configuration:
If unit is to be used in CD mode (non-inverted PWM), this configuration can be utilized during startup and shut-down to eliminate any audible transients. When the startup sequence has completed, and any transients that could cause output voltage perturbations have concluded, SPDT2 70 can simply be flipped to "DOWN" position to enter the CD mode, and normal operation can ensue. Upon audio turn-off (shutdown, mute, etc.), SPDT2 70 can simply be flipped back to "UP" NC position to disconnect the speaker 64 and prevent any pops/clicks from occurring.

If two units (i.e. two channels with two sub-channels each) are used, and the two units do not share the same physical ground ("GND") node (i.e. the GND node is not referenced to chassis for instance), then this LD mode can be used in one of the amps, which is serving as backup. In such a 1:1 redundant system, the total system configuration would appear as shown in FIG. 8.

Figure 8:
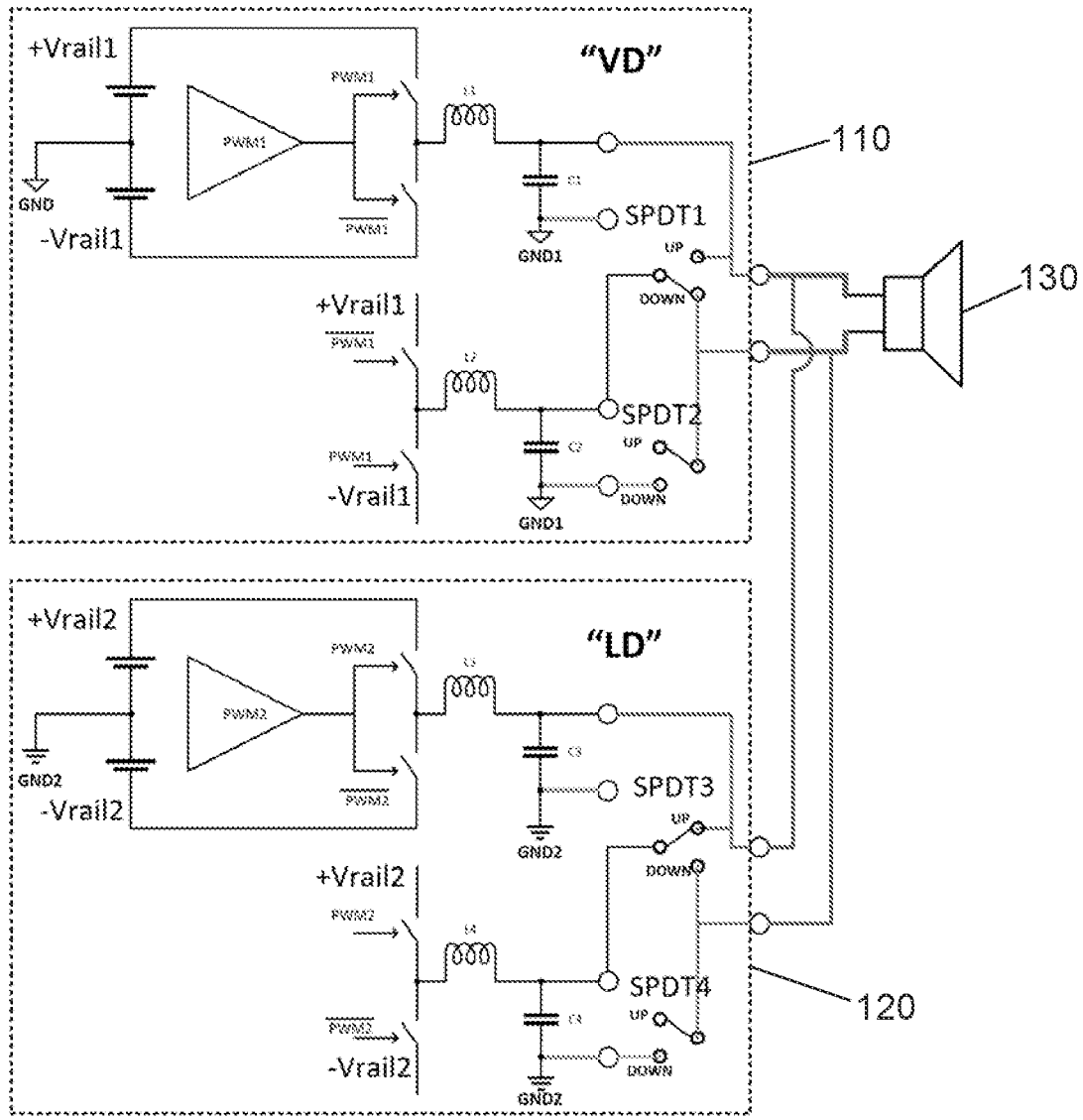
FIG. 8 is a schematic of an upper amplifier in the "VD" configuration, while a redundant, lower amplifier is in the "LD" configuration.

Referring to FIG. 8, a two-channel amplifier (with two sub-channels each0 includes an upper sub-channel 110 in a voltage doubling configuration and a lower sub-channel in a load disconnect configuration. In normal (fault-free) operation, the lower amp 120 is completely disconnected from the loudspeaker 130, and the two HB outputs for the redundant channel are either not switching at all (no need), or they are switching in lockstep with each other (non-inverted PWM). Therefore, the upper amp channel 110 is not driving the lower amp channel 120, but only the speaker 130.

In case of a fault, the configuration is simply swapped. Assume the upper amp 110 was the redundant one, which has now taken over operation, whereas the lower amp 120 was the primary one, (which has failed). As soon as the lower amp 120 fails, it halts switching and changes configuration, then the redundant amp changes configuration and resumes operation.

In case the failed (lower) amp is causing a short from the midpoint of the HB to one of the rails, then that whole amp simply becomes 'referenced' to that rail (since the ground-points are not connected between the two amps). No current will flow in lower amp HB or from the lower amp into the speaker. The upper amp channel 110 is thus free to drive the speaker 130 without influence from the lower amp channel 120.

Figure 9:
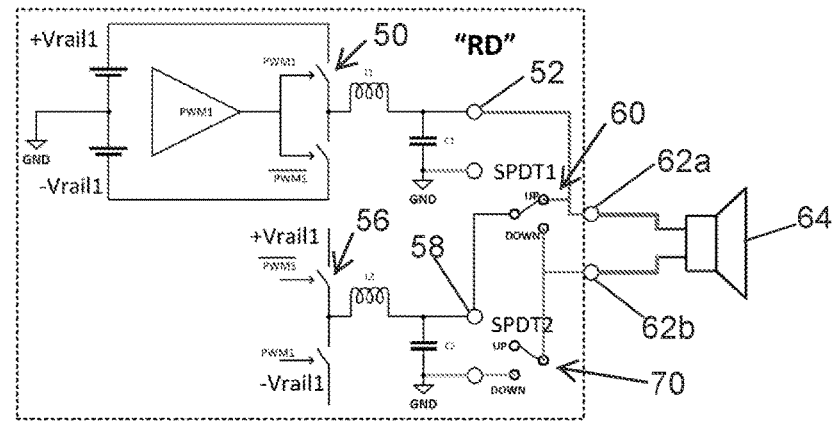
FIG. 9 is a schematic of an amplifier in a Rail Discharge ("RD") configuration.

Configuration 4—Rail Discharge ("RD"):
  The RD configuration is selected by:
  SPDT1 60=UP
  SPDT2 70=UP
  PWM=Inverted In the configuration shown in FIG. 9, the speaker is disconnected by virtue of SPDT2 70 being in the no connection position, which means it will be unaffected by any transients caused by the amplifier. The two sub-channel HB 'positive' outputs 52, 58 are connected together by the position of SPTD1 60 (and the 'negative' ones share a common GND). The inversion of the PWM signals applied to each sub-channel effectively means the classic BTL configuration (VD mode) is used, but the output 'shorted' by SPDT1 60 (it's impedance). Executing a controlled PWM pattern will dissipate a (controlled) amount of power in the parasitic resistances (i.e. MOSFETs, PCB traces, SPDT1, L1, etc.). Such a configuration and execution can result in a controlled (and predictable/selectable) discharge of the voltage rails. It is desirable to discharge the rails, which is normally done by bleeder resistors. A benefit of a scheme such as presented here is not only saving the bleeder resistors, but also eliminating the (constant) power dissipation in them during normal operation (where discharge is not desirable).

Other Configurations
Out of the 8 logic combinations of SPDT positions and PWM inversion, 4 remain that have not been covered in the above. These are:
(5): SPDT1=UP, SPDT2=DOWN, PWM=Inverted;
(6): SPDT1=DOWN, SPDT2=UP, PWM=Not Inverted;
(7): SPDT1=DOWN, SPDT2=DOWN, PWM=Not Inverted; and
(8): SPDT1=DOWN, SPDT2=DOWN, PWM=Inverted.

Configuration 5 'shorts' the two HB outputs together—just as is the case with CD mode, however, the inversion of the PWM signal means the two HB's will play into a 'short'. It may be relevant to use this mode for Rail Discharge (instead of using Configuration 4), however it may lack the advantage of disconnecting the speaker during the rail discharge. Therefore, Configuration 4 might be preferred for rail discharge.

Configuration 6 is similar as "VD" mode, but with the PWM not inverted, there will ideally be no current flowing out of the HB's (and no current flowing in the speaker), although the speaker is virtually shorted (not open).

Configuration 7 and 8 both short the lower HB internally (regardless of PWM inversion). The speaker remains connected, so although any of these modes could be used for rail discharge, Configuration 4 is still preferred for that function.

As will be appreciated, an amplifier using the described circuitry includes a processor or other logic circuitry (ASIC, FPGA or the like) to set the position of the various switches in order to connect the sub-channels in either the CD, VD, LD or RD modes and to invert or not invert the PWM signal supplied to the slave sub-channel. In some embodiments, a user determines how they would like to drive the speaker load using an input (switches, keypad, dip-switch setting, jumper setting, PCB stuffing, etc. on the amplifier chassis) or via a wired or wireless computer communication link to an external device (remote controller, smart phone, laptop etc.) In some embodiments, the user is prompted to enter information about the speaker load (such as speaker impedance and maximum power capacity) and the processor determines the appropriate setting of the switches. In other embodiments, the processor determines the appropriate settings of the switches based on test signals supplied to the speaker load, or other means for the processor to gain information about the speaker load (such as a communication link between the speaker and the processor, such that the speaker may "identify" itself).

Gaining information about a speaker could be done in several ways based on test signals, "live-monitoring" of the speaker signals, or a dedicated "Identification mechanism" of the speaker.

Example 1: apply a voltage to the speaker and measure the amplitude of the resulting current (or the dual; apply a current and measure the voltage). This will give (by ohm's law) an indication of the (DC) resistance of the speaker.

Example 2: apply a non-DC voltage or current and measure the resulting amplitude of the other—this gives an idea of impedance ("resistance") at a specific (non-DC) frequency. If also measuring the delay (phase), this provides information about complex impedance (non-resistive, such as inductive and capacitive).

Example 3: apply a frequency sweep and measure amplitude and phase—this provides a measure of a complex impedance as a function of frequency.

Figure 16:
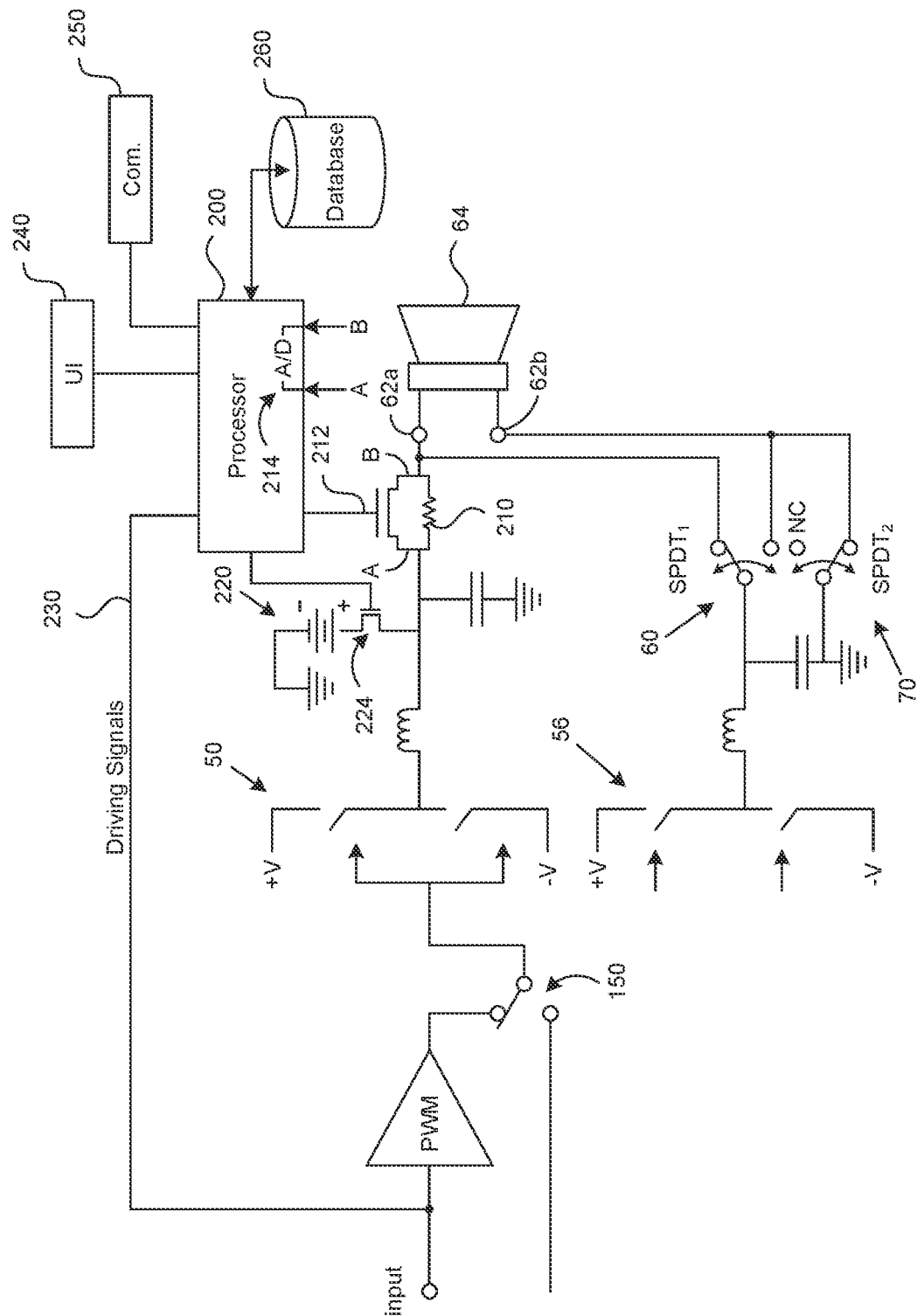
FIG. 16 is a block diagram of an amplifier including a processor configured to set the configuration of the sub-channels in accordance with a detected impedance of a speaker load in accordance with some embodiments of the disclosed technology.

Example 4: employ a configuration for reading information from the speaker to be uniquely identified (or identify itself) by a way of communicating data regarding the impedance of the speaker. Normally only audio power is handled by the speaker connection, but with a third wire or using the two existing wires (or a separate communication link between speaker and processor), the speaker can provide information stored in a non-volatile memory or other method of encoding the information on the speaker in order to "tell" the processor about what configuration is optimal for it, about the make and model of it, or even information about its maximum voltage, current and power capabilities. In one embodiment, a processor of the system is programmed to measure the impedance of the speaker load by inserting a small resistance in line with the speaker load and measuring the voltage across the resistance with an analog to digital converter circuit. For example, a small resistor can be inserted in line with the speaker and bypassed with a MOSFET or other switch when current is not being measured. FIG. 16 shows a block diagram of a amplifier channel with a processor 200 that is configured to selectively insert a resistor 219 in line with a speaker load 64. The processor 200 preferably includes an analog to digital converter (either internal or external) 214 that is configured to detect the voltage drop across the resistor 210 to determine the current though the load.

In one embodiment, the processor can control a transistor or other switch 224 to apply a battery voltage 220 to the speaker terminals and measure the resulting current flowing through the resistor 210 using the analog to digital converter 214. In another embodiment, the processor 200 produces a test signal that is applied to an input of the pulse width modulator in order to produce a known AC or DC voltage at the output of the subchannel and to measure the current flowing through the resistor 210. Knowing the voltage and current through the speaker load, the processor can compute the speaker impedance.

Alternatively, the processor 200 may receive information about the speaker load from a user interacting with a user interface 240 or via a wired or wireless communication circuit 250. In some other embodiments, the processor controls a RFID tag reader or other device to interrogate a memory tag associated with the speaker load. In some embodiments, the make and model of the speaker are stored in a database 260 or other computer readable memory structure along with the speaker's impedance and power rating in order to allow the processor 200 to determine whether the speaker should be driven by one sub-channel, two sub-channels connected in parallel or two sub-channels connected in a bridge tied load configuration.

An amplifier may include more than one channel (2 sub-channels). For example, a single amplifier chassis may have 2 channels (4 sub-channels) or more.

Aspects of embodiments of the disclosed technology effectively eliminates—to a large extent—compromises and drawbacks of conventional systems. For example:

The internal switches of a channel allow a pair of HB sub-channels to be manually or automatically (based on impedance sensing) connected for:
  Current Doubling, where current limitations are removed (i.e. low-Z loads). In this configuration, two channels (with sub-channels) can still be externally BTL'ed in traditional manner.
  Voltage Doubling, where voltage limitations are removed by an internal BLT connection (i.e. for high-Z loads).
Only one set of input and output connections, modulators, etc. are required per channel;
The internal connections allow a speaker load to be disconnected to provide pop/click elimination in CD mode;
Redundant channels can be connected to a load provided they do not share a common ground; and
The internal switches allow a "lossless" rail discharge with an appropriate PWM driving signal;
The single set of output terminals allow a user to connect a speaker load in a conventional manner and still drive the speaker load in a parallel HB mode or a BTL mode with no difference how the speaker is connected (unless traditional, external BTL is used).

Figure 10:
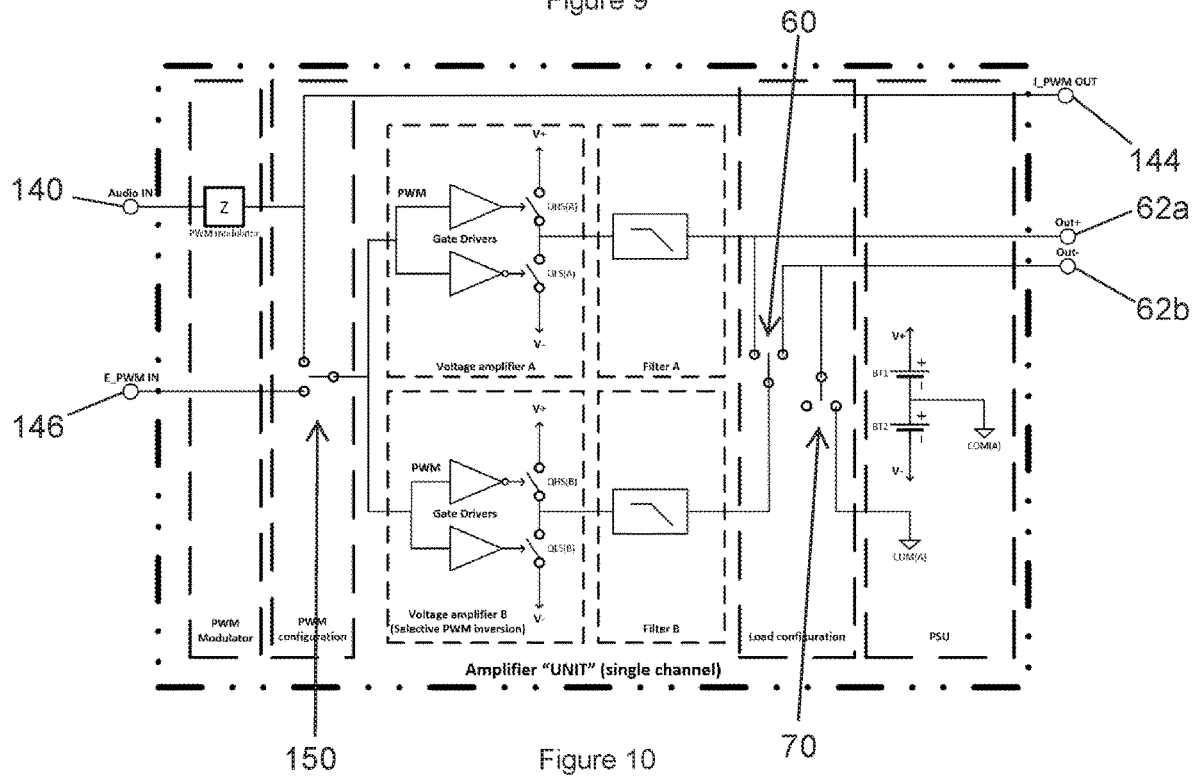
FIG. 10 is a schematic of an amplifier channel or amplifier "unit" according to at least one embodiment of the disclosed technology comprising a Pulse Modulation configuration circuit routing externally provided Pulse Modulation signals or internally generated Pulse Modulation signals to first and second sub-channels within the amplifier channel.

FIG. 10 is a block diagram of a single amplifier channel including two sub-channels. The amplifier channel includes an audio signal input connector 140 that is connected to an internal PWM modulator (or other Pulse Modulation technique) that converts input audio into the driving signals for the half bridges for the pair of sub-channels. The PWM signals are also routed to an output connector 144 of the amplifier channel so that the same PWM signals can be used to drive the half bridges of another amplifier channel if desired. A switch 150 in the amplifier selectively connects the gate drivers of the two half-bridges (sub-channels) to the driving signals produced by the internal modulator or to an input 146 that provides PWM signals from an external PWM modulator. In this manner, the gate drivers can be driven with externally generated PWM signals if desired. Included but not shown in the block diagram is an inverter circuit that selectively inverts the PWM signals applied to one set of gate drivers to be used when the amplifier channel is set up in the voltage doubling (VD) configuration.

The gate drivers for each sub-channel operate in tandem with a single internally generated or externally supplied PWM signal provided to both half bridges, and both half bridges are supplied from same complimentary rails. Tight timing of the PWM signals supplied to the gate drivers of both sub-channels is employed to ensure sufficient current sharing (and voltage sharing) between the subchannels two legs of voltage amplifiers. Such tight timing can be achieved by minimizing routing path differences in the printed circuit boards that deliver the driving signals to the gate drivers as disclosed in the '913 patent. Each sub-channel includes an output filter. A load configuration circuit includes a pair of single pole double throw switches that are controllable to connect the outputs of the sub-channels to the same speaker terminal for current doubling or to different speaker terminals for voltage doubling in "Full-bridge" mode.

A Power Supply Unit, which is not chassis referenced, and which is able to supply at least one set of half-bridges with appropriate voltage (~+/−80 VRMS for 100V distributed audio in "Full-Bridge"-mode) and current (sufficient RMS current for rated power in a "parallel" supply mode for of low-Z speaker loads) and power (concurrent voltage and current) for rated channel power;

Feedback is not necessary but is practical and fairly ubiquitous in industry. In some embodiments, a single feedback system for the master sub-channel controls both the master and slave sub-channels (for the channel unit and not one feedback channel per half bridge HB).

Configuration options (excluding selection of PWM source) depend on the status of the two SPDT switches in the Load Configuration circuit and the inversion status of the PWM signals for voltage amplifier B (second sub-channel) (in relation to voltage amplifier A (first sub-channel)). There is a total of eight logic combinations (SPDT cannot be "NC" although they appear so in the figure above). Four of these logic combinations are of particular interest as described in A-B-C-D below:

A. Parallel: PWM is not inverted (i.e. same PWM for the half bridges of both sub-channels B), the outputs of both half bridges feed out to the same spk+terminal and return from the spk−terminal.

B. Full-Bridge: The PWM signal for one of the two sub-channels is inverted (e.g. opposite PWM for the two half bridges). The output of the first sub-channel HB(A) is output to the spk+terminal and "return" from the speaker spk−terminal is connected to the output of the other sub-channel.

Figure 14:
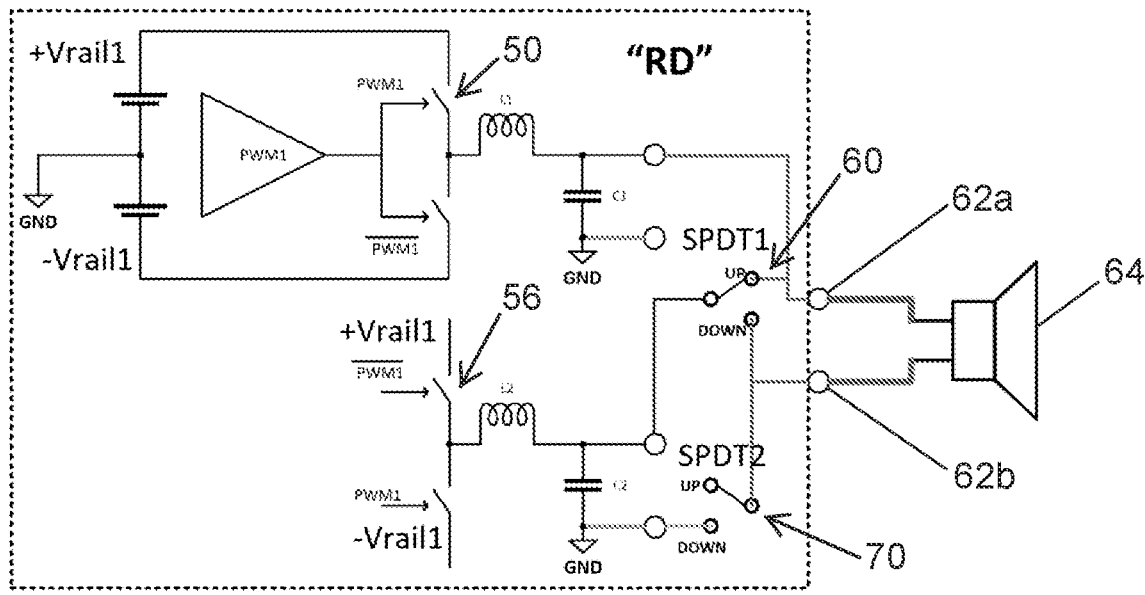
FIG. 14 is a schematic of an amplifier unit in a rail discharge (RD) configuration that keeps the speaker load disconnected, while providing an appropriate PWM signal for discharging the rails into a near-short (some parasitic resistance will cause power dissipation depending on the parasitic resistance in the components and traces around the loop).

C. Load Disconnect: Mid-point of complimentary power supply units (PSUs) (and "return" for parallel configuration not to be chassis-referenced), since this allows for 1:1 amp redundancy (LD {Load Disconnect} mode). As shown in FIG. 14, the two amplifier channels can be either two separate amps (2 physical enclosures—each stand-alone amplifiers or possibly multi-channel amplifier), or they can exist as two "Zones" within a single enclosure provided they do not share power-supplies, and their power supplies are not referenced to the same physical connection.

D. Rail Discharge As shown in FIG. 14, the outputs of the first and second sub-channels are connected together and one of the subchannels is driven with an inverted PWM signal. In this configuration enabling the subchannels act to bleed the (high) voltage rails and other components within the amplifier without the need for bleed resistors that continually dissipate power.

In some embodiments, the system is self-contained and does not need a physically different (input and speaker) wiring connections to terminals/connectors on the exterior of the product enclosure depending on the chosen configuration.

Configuration A is capable of high current and appropriate for use with a low-impedance speaker (such as 2 Ohms).

Configuration B is capable of high voltage and appropriate for use with constant-voltage impedances (such as 70V or 100V distributed audio).

Configuration C allows for 1:1 amplifier redundancy (either internally in a single chassis by having two separate PSU domains or externally due to the PSUs not being chassis referenced).

Configuration D allows for the rail capacitors to be actively discharged. All configurations share identical external wiring.

Figure 15:
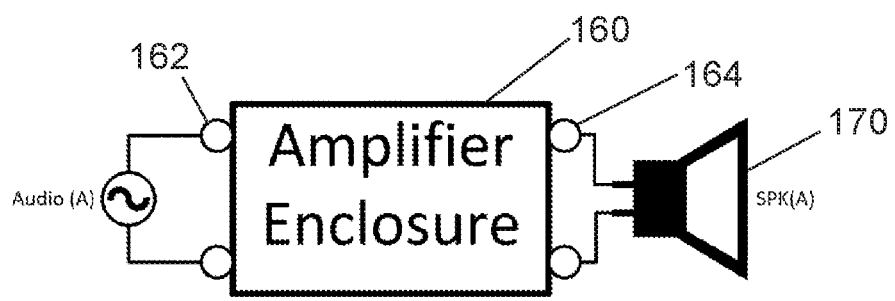
FIG. 15 is simplified diagram of an amplifier in accordance with aspects of the disclosed technology showing identical universal physical wire connections regardless of the chosen internal configuration.

The 'virtual' speaker wiring is done internally via switches SPDT1 and SPDT2, which may be implemented with relays (or other electronically controlled switches including transistors or could be mechanically controlled switches). Although these switches are described with respect to their use with class D half bridges, the switches could be adapted to work with any audio amplifier topology (including class A, B, A/B, H, etc.). A single-channel finished amplifier product diagram is shown in FIG. 15 depicting the necessary audio input and output connections that remain unchanged (from a "black-box" enclosure perspective). A multichannel amplifier simply replicates input/output terminal sets. It is thus possible to change from one configuration to another without being physically present at the interconnects (amplifier product or speaker load); rather this could be done via (electronic) commands sent through a communications interface (wired or wireless).

Figure 11:
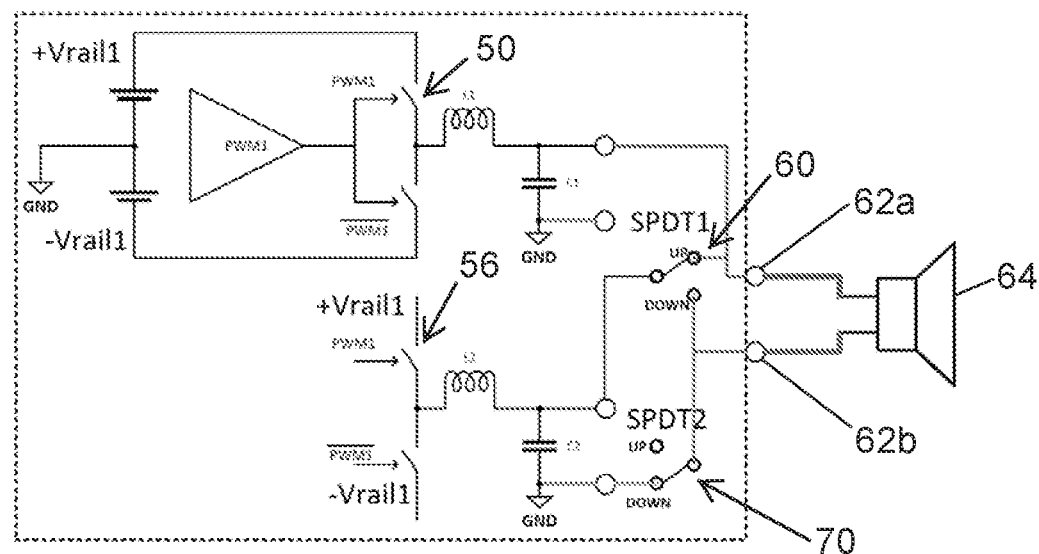
FIG. 11 is a schematic of an amplifier unit with a sub-channel receiving a non-inverted PWM in a load configuration set to "CD" or parallel. An output SPDT saves one set of two speaker terminals (and an input signal connection).
Figure 12:
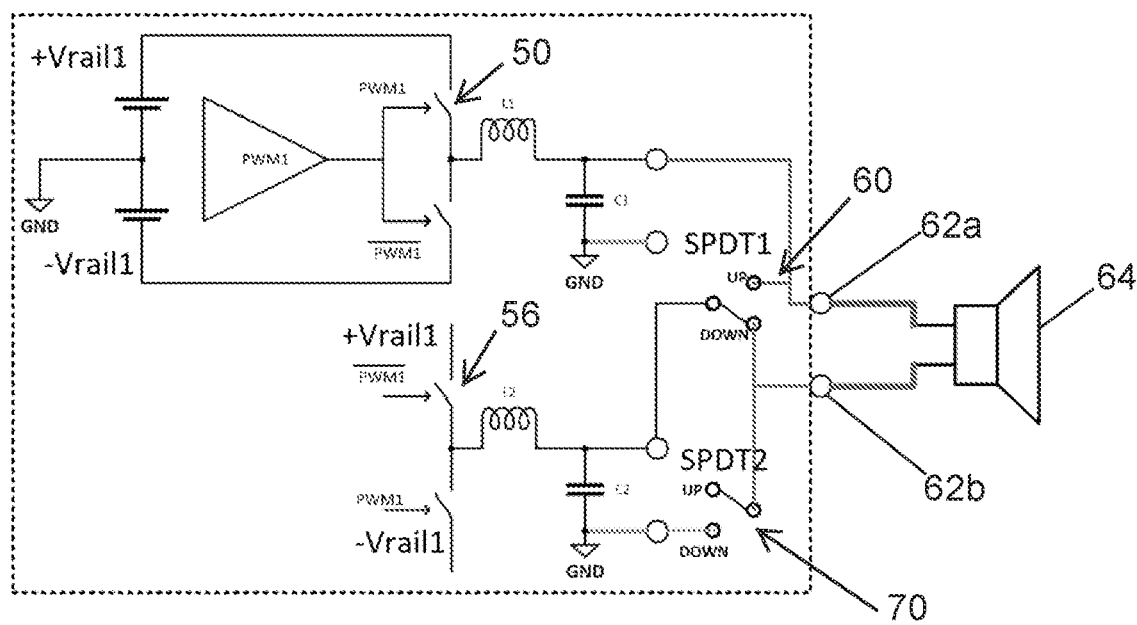
FIG. 12 is a schematic of an amplifier unit with a sub-channel receiving an inverted PWM in a full-bridge coupling of the two internal sub-channels.
Figure 13:
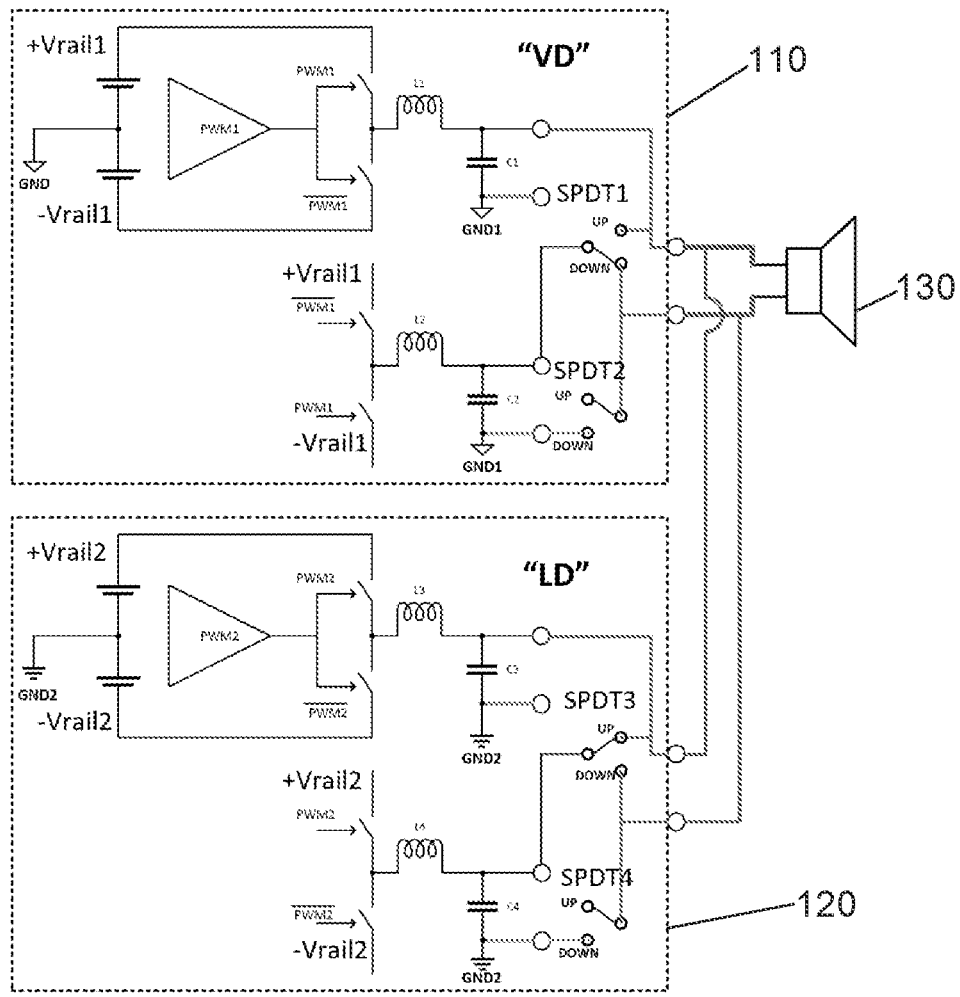
FIG. 13 is a schematic of an amplifier unit with two amplifier channels having two power supply units (PSUs) that are not co-referenced (i.e. do not share a common ground). The two amplifier channels (units) can be each-other's redundant backup.

Two or more of such amplifier channels (two or more pairs of half bridge sub-channels) may externally combined in parallel or BTL (regardless of their internal configurations). See FIG. 11 for "PWM configuration" options. In such a case, the first channel (Ch Y—which is one instance of a "unit" similar to that shown in FIG. 11) receives an audio input and generates PWM from its internal PWM modulator, which is sent to its internal voltage amplifier channels. The second channel (Ch Z, which is also a 'unit') is configured to receive PWM from an external source—specifically the PWM output from Ch Y).

The system configuration can be selected manually by operator (by dip-switch setting, jumper setting, PCB stuffing or programming via a wired or wireless communication interface) or autonomously (by a processor in the system recognizing load impedance via measurement and/or approximation/estimation and selecting the appropriate configuration based on a look-up table, memory content or similar information storage device), or a hybrid with the default being autonomously selected by the system with possible override by operator, and or instructions being provided to an operator (for dip-switch setting or otherwise) via a screen (either physically on the amplifier product or connected to it by wired or wireless connection).

Preferably feedback for both sub-channels of an amplifier channel is taken only from a single half bridge. In one embodiment, the feedback uses a pre-filter voltage from SW-node1 (referenced to "GND")—or the output filter inductor current, and post-filter (voltage) from right side of L1 (referenced to "GND"). See FIG. 1 for reference. Feedback could alternatively be configuration-based; where an output voltage feedback is taken directly across the speaker terminals, and/or the "inner loop" may be a differential switch-node voltage or an inductor current. In that case, the compensator (feedback transfer function) may need to be adjusted based on the configuration of the channel.

The system may be clocked or self-oscillating and may be synchronized (to the power-supply switching) or not synchronized. The output filter inductors may or may not be coupled. One or more half bridge pairs may be incorporated into an Integrated Circuit ("IC") with a configuration input (digital or analog) for selecting the inversion status of one of the PWM signals, and whether to use externally provided PWM or internally generated PWM. Such IC may contain none, one or more of each of the following categories of circuits (but are not limited to these): gate-drivers, PWM modulators, error amplifiers, compensation structures, switching transistor half-bridges. Such ICs may include circuitry for directly replicating an input PWM (from an external source) to an output PWM (voltage amplified or gate-driver outputs) and/or provide its internally generated PWM as an output for a different IC.

Two or more half bridges supplied by individually referenced power supplies may always share non-inverted PWM signals from a single PWM modulator, and their outputs (2 terminals per half bridge) combined in parallel or in series depending on the need for current or voltage. This combining may be done internally inside the enclosure or externally on the exterior of the enclosure (i.e. an operator physically changing a wiring connection). This expands the "BTL" concept with a maximum of two half bridges combined for "double voltage" to a true series combination or "channel stacking" that strings as many half bridges together as desired. In one example, one could use a 25V technology node for creating eight integrated half bridges on a single, monolithically integrated IC; each capable of 20V output voltage swing. Using eight individually referenced +/−20V power supplies (may be separate windings on a single transformer), the integrated (25V technology node) IC may be used to form a single amplified speaker channel capable of producing 100V RMS of audio including high-speed logic circuitry, op-amps and comparators, etc.

Figure 17:
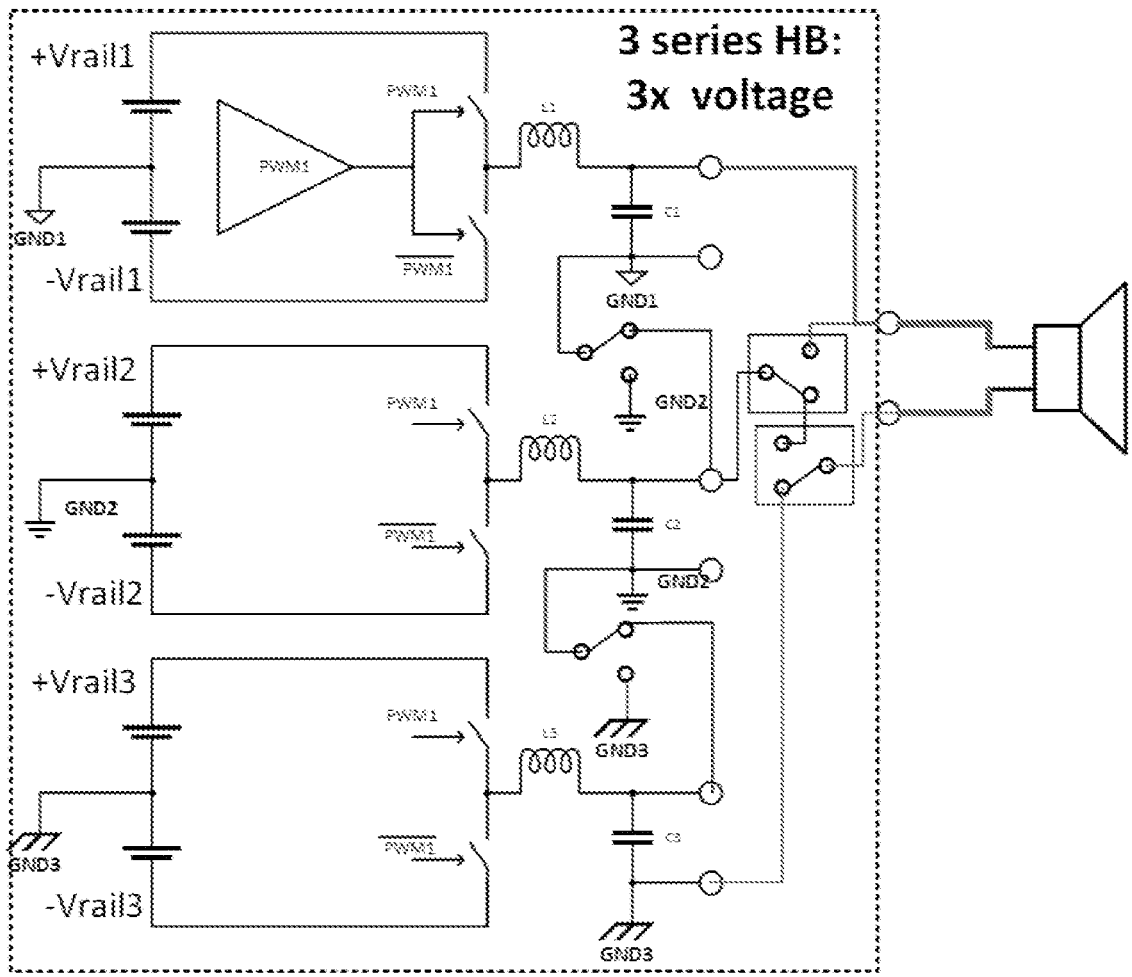
FIGS. 17 shows an amplifier topology that allows sub-channels to be stacked in accordance with some embodiments of the disclosed technology.

In some embodiments of the invention, it is useful to be able to stack numerous lower voltage amplifiers in series to create a larger output voltage. FIG. 17 shows an embodiment of this amplifier topology with three subchannels. In this embodiment, the output of the lower subchannel is connected to the ground of the middle subchannel. The output of the middle subchannel is connected to the ground of the upper subchannel. The output of the upper subchannel is connected to an input of the speaker load. The other input to the speaker load is connected to the ground of the lower subchannel. In this way, the speaker is driven with the sum of the output voltages of the three subchannels.

As can be seen from the different symbols used for the grounds, the grounds of the subchannels are not commonly referenced. Switches can be used within the circuit to selectively connect the outputs of the subchannels to a particular ground if subchannel stacking is desired. Such switches can be internal to an integrated circuit and controlled with an external pin logic level or by a software command. Alternatively, output pins on the amplifier chip can be connected to externally controlled switches to physically or electronically connect the outputs to the various internal grounds as desired. Switches can also be used to connect the outputs of the subchannels to the speaker terminals.

For an amplifier having three subchannels, the switches can be set to drive the speaker with one, two or three subchannels. This technology can be combined with the internal single pole double throw switches described above so that the speaker can also be driven in parallel or a bridge tied load configuration. For example, three subchannels can be configured to either operate in BTL, parallel, or a triple voltage mode.

In the arrangement shown in FIG. 17, all the subchannels are driven with the same set of modulation signals. Therefore, care should be taken in the layout of the circuit to ensure minimal delay differences the source of the modulation signals and the output transistors of the various subchannels so that they open and close (e.g. conduct and non-conduct) at substantially the same time to reduce any noticeable distortion. The topology shown in FIG. 17 is particularly useful if the subchannels are to be created on a single integrated circuit. The topology is extendable to N subchannels. For example, a 100-volt amplifier circuit can be made from five 20-volt amplifier circuits.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus.

A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium also can be, or can be included in, one or more separate physical components or media (e.g., multiple CDs, disks, or other storage devices). The operations described in this specification can be implemented as operations performed by a data processing apparatus on data stored on one or more computer-readable storage devices or received from other sources.

The term "processor" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit).

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., solid state memory cells, magnetic, magneto-optical disks, or optical disks. However, a computer need not have such devices. Moreover, a computer can be embedded in another device, e.g., a mobile telephone, a personal digital assistant (PDA), a mobile audio or video player, a game console, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can include a display device, e.g., an LCD (liquid crystal display), LED (light emitting diode), or OLED (organic light emitting diode) monitor, for displaying information to the user and a keyboard and a pointing device, e.g., a mouse or a trackball, by which the user can provide input to the processor. In some implementations, a touch screen can be used to display information and to receive input from a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

We claim:

1. An amplifier configured to drive a speaker load, comprising:
    a first sub-channel configured to create an amplified version of an input signal with a modulated driving signal;
    a second sub-channel configured to create an amplified version of the input signal with the modulated driving signal;
    first and second speaker terminals to which the speaker load can be connected, wherein an output of the first sub-channel is connected to the first speaker terminal; and
    a single pole double throw (SPDT) switch connected to an output of the second sub-channel, wherein the SPDT switch has a first position and a second position, and wherein the SPDT switch is configured to:
        when the SPDT switch is in the first position, connect the output of the second sub-channel to the first speaker terminal to drive the speaker load in a parallel configuration, and
        when the SPDT switch is in the second position, connect the output of the second sub-channel to the second speaker terminal so that the first sub-channel and the second sub-channel can drive the speaker load in a bridge-tied-load configuration.

2. The amplifier of claim 1, where the amplifier further includes:
    an input signal port on which the input signal is received; and
    a single internal modulator coupled to the input signal port that is configured to produce the modulated driving signal from the input signal.

3. The amplifier of claim 2, where the amplifier includes:
    an input port on which the modulated driving signal from an external modulator can be received; and
    a switch that is configured to connect the modulated driving signal from the internal modulator or the modulated driving signal from the external modulator to the first and second sub-channels.

4. The amplifier of claim 1, further including an inverter that selectively inverts a polarity of the modulated driving signals when the SPDT switch is in the second position to drive the speaker load in a bridge tied load configuration.

5. The amplifier of claim 1, wherein the first and second sub-channels each include a half bridge amplifier with transistors that are driven by the modulated driving signal to produce the amplified version of the input signal.

6. The amplifier of claim 1 wherein the SPDT switch is a first SPDT switch, and wherein the amplifier further comprises:
    a second SPDT switch connected to the second speaker terminal, wherein the second SPDT switch has a first position and a second position, and wherein the first position of the second SPDT switch is configured to connect a ground of the second sub-channel to the second speaker terminal when the speaker load is to be driven in the parallel configuration.

7. The amplifier of claim 6, wherein the second position of the second SPDT switch is a no contact position that is used when the speaker load is to be driven in the bridge tied load configuration.

8. The amplifier of claim 6, further comprising a processor that is configured to execute instructions to set the positions of the first and second SPDT switches.

9. The amplifier of claim 8, further comprising:
an input signal port on which the input signal is received; and
a single internal modulator coupled to the input signal port that is configured to produce the modulated driving signal from the input signal,
wherein the processor is further configured to execute instructions to produce the input signal for the single internal modulator.

10. The amplifier of claim 9, wherein the processor is further configured to execute instructions to set the first SPDT switch in the first position and to control an inverter to invert a polarity of the input signal produced by the processor for the single internal modulator in order to reduce voltages on power supply rails of the first and second sub-channels.

11. The amplifier of claim 6, further comprising a processor that is configured to execute program instructions to determine an impedance and power rating of a speaker load attached to the first and second speaker terminals and to set the position of the first and second SPDT switches in accordance with the determined impedance and power rating.

12. The amplifier of claim 1, further comprising a processor that is configured to execute program instructions to receive information about an impedance and power rating of a speaker load supplied on a user interface.

13. An amplifier, comprising:
a first sub-channel configured to create an amplified version of an input signal with a modulated driving signal;
a second sub-channel configured to create an amplified version of the input signal with the modulated driving signal;
first and second speaker terminals to which a speaker load can be connected, wherein an output of the first sub-channel is connected to the first speaker terminal; and
a switch connected to an output of the second sub-channel and having a first position and a second position, wherein:
in the first position, the switch connects the output of the second sub-channel to the first speaker terminal to drive the speaker load in a parallel configuration,
in the second position, the switch connects the output of the second sub-channel to the second speaker terminal to drive the speaker load in a bridge-tied-load configuration, and
the switch is operable between the first position and the second position to alternate between the parallel configuration and the bridge-tied-load configuration without connecting the speaker load to additional terminals.

14. The amplifier of claim 13 wherein the switch is a first switch, and wherein the amplifier further comprises a second switch connected to the second speaker terminal and having a first position and a second position, wherein:
in the first position, the second switch connects the second speaker terminal to a ground to facilitate driving the speaker load in the parallel configuration,
in the second position, the second switch is in a no contact position to facilitate driving the speaker load in the bridge-tied-load configuration.

15. The amplifier of claim 13, further comprising a processor that is configured to determine an impedance and power rating of the speaker load attached to the first and second speaker terminals and to operate the switch between the first position and the second position based on the determined impedance and power rating.

16. The amplifier of claim 15, wherein determining the impedance of the speaker load includes activating a circuit to measure a current through the speaker load in response to a modulated driving signal that produces a known voltage at the outputs of the first or second subchannels.

17. An amplifier configured to drive a speaker load, comprising:
a first half bridge sub-channel configured to create an amplified version of an input signal with a modulated driving signal;
a second half bridge sub-channel configured to create an amplified version of the input signal with the modulated driving signal;
first and second speaker terminals to which a speaker load can be connected, wherein an output of the first half bridge sub-channel is connected to the first speaker terminal; and
a single pole double throw (SPDT) switch within the amplifier that is controllable to connect an output of the second half bridge sub-channel to the first speaker terminal to drive the speaker load in parallel or to connect the output of the second sub-channels to the second speaker terminal to drive the speaker load in a bridge tied load configuration.

18. The amplifier of claim 17, further comprising an internal modulator that is configured to produce modulated driving signals for the first and second half bridge sub-channels.

19. The amplifier of claim 18, further comprising an input on which the modulated driving signal can be received from an external modulator and a switch for connecting the modulated driving signal from the internal modulator or from the external modulator to the first and second half bridge sub-channels.

20. The amplifier of claim 17, further comprising a processor that is configured to execute instruction to determine an impedance and power rating of the speaker load and to set a position of the switches based on the determined impedance and power rating.

\* \* \* \* \*